United States Patent
Ploessl

(10) Patent No.: US 10,361,350 B2
(45) Date of Patent: Jul. 23, 2019

(54) OPTOELECTRONIC COMPONENT AND PRODUCTION METHOD THEREFOR

(71) Applicant: OSRAM Opto Semiconductors GmbH, Regensburg (DE)

(72) Inventor: Andreas Ploessl, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/735,587

(22) PCT Filed: Jun. 9, 2016

(86) PCT No.: PCT/EP2016/063113
§ 371 (c)(1),
(2) Date: Dec. 11, 2017

(87) PCT Pub. No.: WO2016/198502
PCT Pub. Date: Dec. 15, 2016

(65) Prior Publication Data
US 2018/0315910 A1    Nov. 1, 2018

(30) Foreign Application Priority Data

Jun. 11, 2015   (DE) ......................... 10 2015 109 333

(51) Int. Cl.
*H01L 33/62*    (2010.01)
*H01L 33/48*    (2010.01)
(Continued)

(52) U.S. Cl.
CPC ............ *H01L 33/62* (2013.01); *H01L 33/486* (2013.01); *H01L 33/54* (2013.01); *H01L 21/568* (2013.01);
(Continued)

(58) Field of Classification Search
CPC ....... H01L 33/62; H01L 33/486; H01L 33/54; H01L 2933/005; H01L 2224/04105;
(Continued)

(56) References Cited

U.S. PATENT DOCUMENTS 7,365,407 B2    4/2008   Ng et al.
8,723,192 B2    5/2014   Weidner et al.
(Continued)

FOREIGN PATENT DOCUMENTS

DE    102007019809 A1    11/2007
DE    102009036621 A1    2/2011
(Continued)

*Primary Examiner* — Selim U Ahmed
(74) *Attorney, Agent, or Firm* — Slater Matsil, LLP

(57) ABSTRACT

An optoelectronic component and a method for producing an optoelectronic component are disclosed. In an embodiment the component includes a semiconductor chip, a molded body and an electrical through-contact constituting an electrically conductive connection through the molded body. The through-contact and the semiconductor chip are embedded alongside one another and are spaced apart in the molded body. A first contact pad of the through-contact is arranged at an underside of the molded body. A second contact pad of the through-contact is arranged at a top side of the molded body. The second contact pad is electrically conductively connected to the electrical contact of the semiconductor chip. The through-contact is arranged such that a molded body is arranged at least in a section between the first and second contact pads on a straight line between the first and second contact pads.

18 Claims, 8 Drawing Sheets

(51) Int. Cl.
*H01L 33/54* (2010.01)
*H01L 21/56* (2006.01)

(52) U.S. Cl.
CPC .......... *H01L 2224/04105* (2013.01); *H01L 2224/19* (2013.01); *H01L 2224/24* (2013.01); *H01L 2224/82* (2013.01); *H01L 2224/82005* (2013.01); *H01L 2933/005* (2013.01); *H01L 2933/0033* (2013.01); *H01L 2933/0066* (2013.01)

(58) Field of Classification Search
CPC ......... H01L 21/568; H01L 2224/82005; H01L 2224/82; H01L 2224/24; H01L 2224/19; H01L 2933/0033; H01L 2933/0066
See application file for complete search history.

(56) References Cited

U.S. PATENT DOCUMENTS

| | | |
|---|---|---|
| 9,691,682 B2 | 6/2017 | Sabathil et al. |
| 2004/0125515 A1 | 7/2004 | Popovich |
| 2006/0169991 A1 | 8/2006 | Kikuchi |
| 2011/0127678 A1* | 6/2011 | Shim ............... H01L 21/6835 257/773 |
| 2012/0049348 A1* | 3/2012 | Ro .................. H01L 23/49811 257/737 |
| 2012/0175657 A1 | 7/2012 | Chen et al. |
| 2014/0153263 A1 | 6/2014 | Palaniswamy et al. |
| 2016/0276545 A1* | 9/2016 | Mueller ............ H01L 33/486 |

FOREIGN PATENT DOCUMENTS

| | | |
|---|---|---|
| DE | 102010024862 A1 | 12/2011 |
| DE | 102012212968 A1 | 1/2014 |
| DE | 102013203350 A1 | 8/2014 |
| EP | 1936704 A2 | 6/2008 |
| EP | 2477242 A2 | 7/2012 |
| EP | 2672535 A2 | 12/2013 |
| WO | 2015062867 A1 | 5/2015 |

* cited by examiner

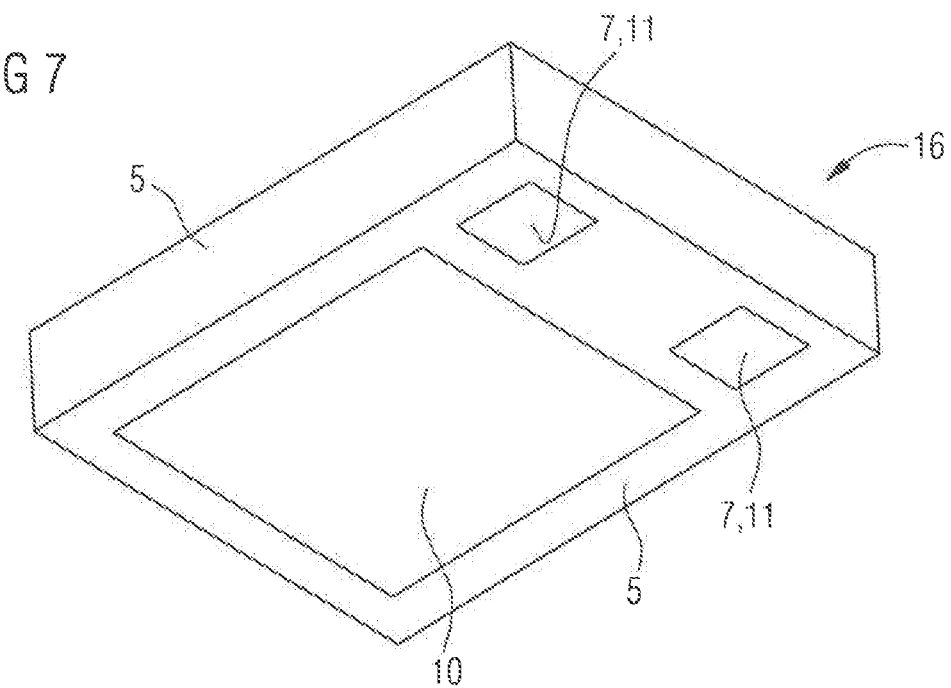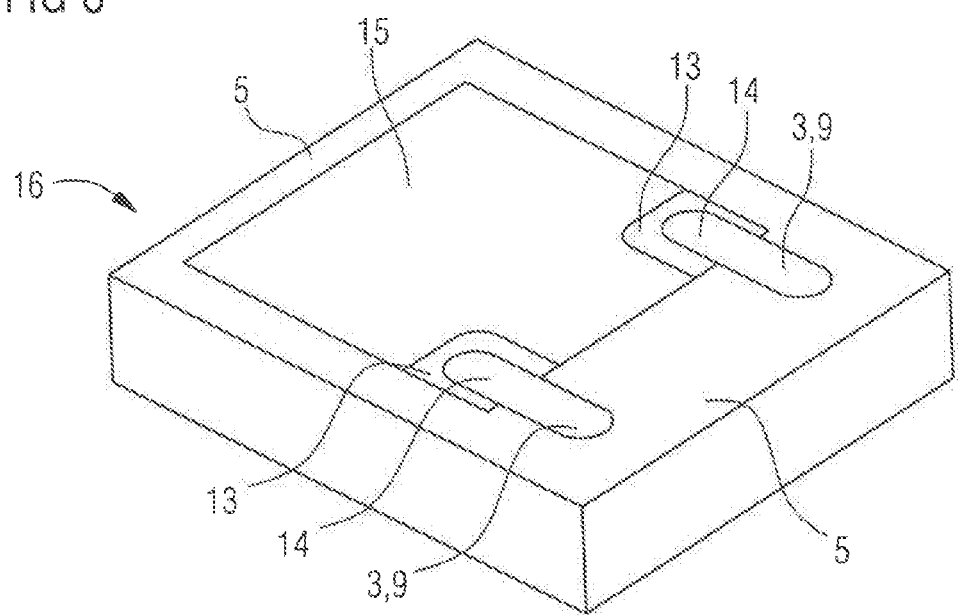

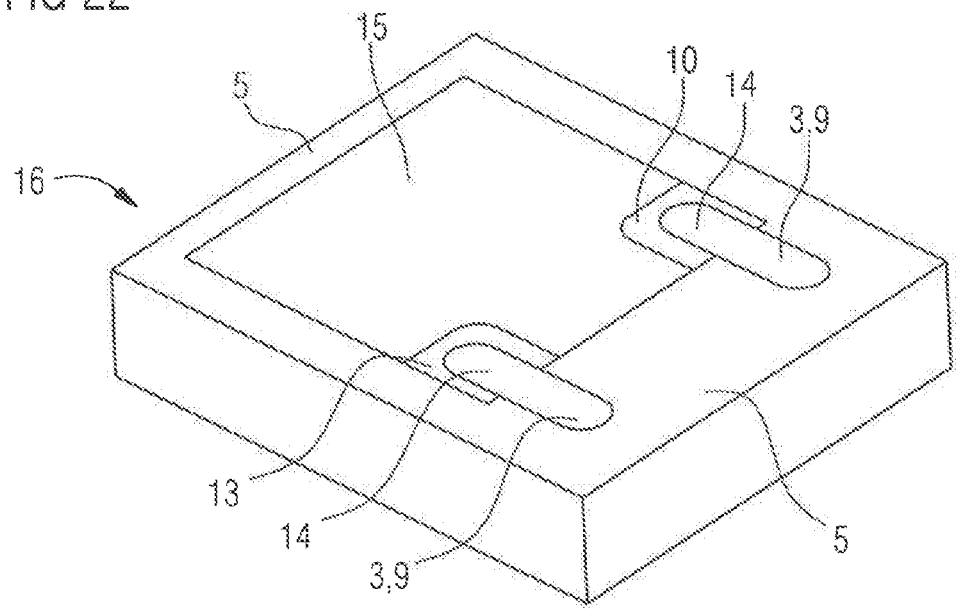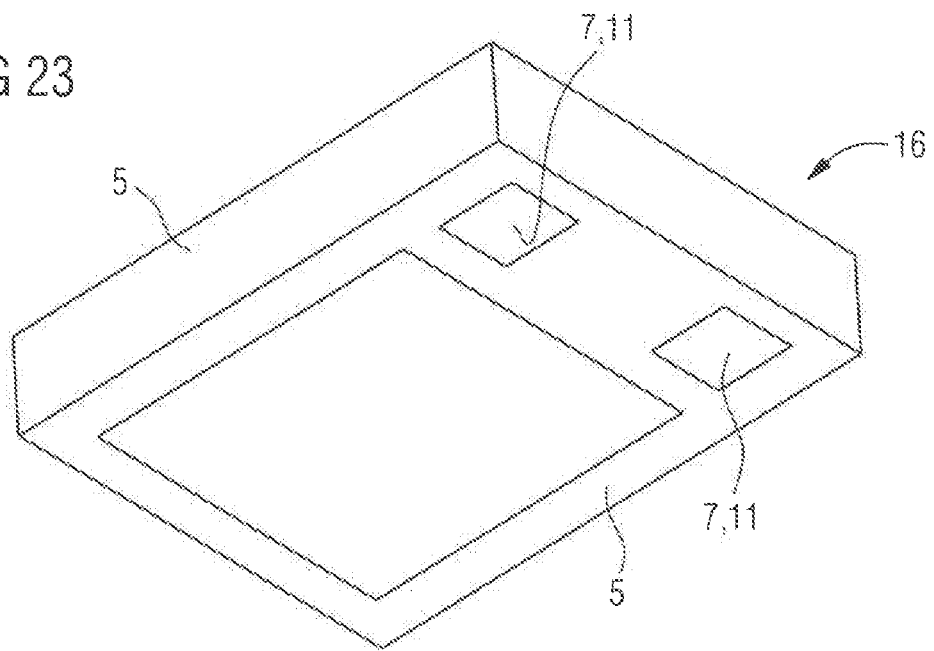

OPTOELECTRONIC COMPONENT AND PRODUCTION METHOD THEREFOR

This patent application is a national phase filing under section 371 of PCT/EP2016/063113, filed Jun. 9, 2016, which claims the priority of German patent application 10 2015 109 333.2, filed Jun. 11, 2015, each of which is incorporated herein by reference in its entirety.

TECHNICAL FIELD

The invention relates to an optoelectronic component and a method for manufacturing an optoelectronic component.

BACKGROUND

German Patent Application Publication No. DE 10 2009 036 621 A1 discloses a method for producing an optoelectronic semiconductor component, wherein an optoelectronic semiconductor chip with a through-contact is embedded into a molded body. The semiconductor chip comprises a first contact on an underside and a second contact on a top side. The second contact is electrically conductively connected to an upper contact pad of the through-contact. In this way, the second electrical contact of the top side of the semiconductor chip is led onto the underside of the molded body.

SUMMARY OF THE INVENTION

Embodiments of the invention provide an improved optoelectronic component and an improved method for producing an optoelectronic component.

One advantage of the proposed component is that the through-contact is better anchored in the molded body. This is achieved by virtue of the fact that the through-contact is configured in such a way that a molded body is arranged at least in a section between the first and second contact pads of the through-contact on a straight line. Consequently, a displacement of the through-contact in relation to the molded body may be at least made more difficult, in particular avoided.

In one embodiment, the through-contact is configured in the form of a folded or bent strip. A strong anchoring of the through-contact in the molded body is achieved as a result. Moreover, a relatively large conduction cross-sectional area for a low electrical resistance is provided by the configuration in the form of the strip.

In a further embodiment, the through-contact is configured in the form of a spiral. The spiral shape enables a relatively high elasticity. Moreover, the spiral shape is relatively insensitive toward damage. Depending on the embodiment chosen, the spiral shape may be arranged with a longitudinal axis parallel to an axis of the through-contact or perpendicular to the axis of the through-contact. The parallel arrangement offers a high stability. The perpendicular arrangement offers a large effective conduction cross-sectional area.

In a further embodiment, the through-contact is configured in the form of at least two or a plurality of conduction elements which are mechanically connected to one another. The conduction elements may be configured in the form of wires or strips. In this case, the ends of the conduction elements may form the first and second contact pads. The conduction elements may be twisted, for example, as mechanical connection. Twisted conduction elements in particular in the form of wires or strips are cost-effective and simple to produce. Moreover, a stable anchoring of the twisted conduction elements in the molded body may be achieved. Furthermore, a relatively large effective conduction cross section may be provided by a corresponding number of conduction elements.

The configuration of the through-contact in the form of a bent or folded strip or in the form of a spiral or in the form of connected conduction elements enables the configuration of a flexible, in particular an elastically and/or plastically deformable, contact element.

In a further embodiment, the through-contact comprises at least one cutout configured, for example, in the form of a depression, a protuberance or a hole. The cutout is filled with the molded body. A strong anchoring of the through-contact in the molded body is achieved in this way.

In a further embodiment, the through-contact configured in the form of a strip comprises at least two sections, in particular three sections, which are arranged substantially parallel to one another and are connected to one another via at least one intermediate section. A stable configuration of the through-contact with at the same time stable anchoring in the molded body is achieved in this way.

In a further configuration, the strip is configured such that it is meandering. A further improved anchoring of the strip in the molded body is achieved as a result.

In addition, embodiments of the invention relate to a method for producing the optoelectronic component.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein FIG. 7 shows a view of an underside of the component, FIG. 8 shows a view of the top side of the component, FIG. 22 shows a view from above of a further embodiment of an optoelectronic component, and FIG. 23 shows a view from below of the component from FIG. 22.

DETAILED DESCRIPTION OF ILLUSTRATIVE EMBODIMENTS

Figure 1:
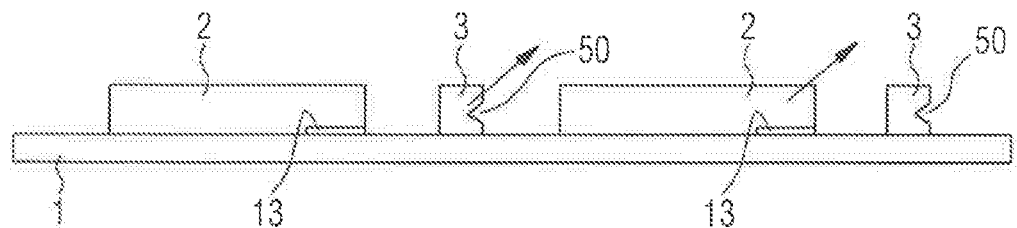
FIGS. 1 to 6 show various method steps for producing the optoelectronic component.

FIG. 1 shows, in a schematic sectional illustration, a first method step for producing an optoelectronic component. A carrier 1 is provided. The carrier 1 may be formed, for example, from metal, such as, for example, copper or aluminum, or from ceramic or from a semiconductor material or from plastic. The carrier 1 may also be configured in the form of a film. Optoelectronic components 2, which are configured, for example, in the form of a laser diode or a light emitting diode or in the form of a photosensor, are secured on the carrier 1. In addition, a through-contact 3 is secured on the carrier 1. The through-contacts 3 comprise a cutout 50. By way of example, an adhesive layer may be used for the purpose of securing, said adhesive layer being applied on the top side of the carrier 1. The optoelectronic semiconductor chip 2 may be arranged on the carrier 1 in such a way that a light emitting side bears on the carrier 1.

Figure 2:
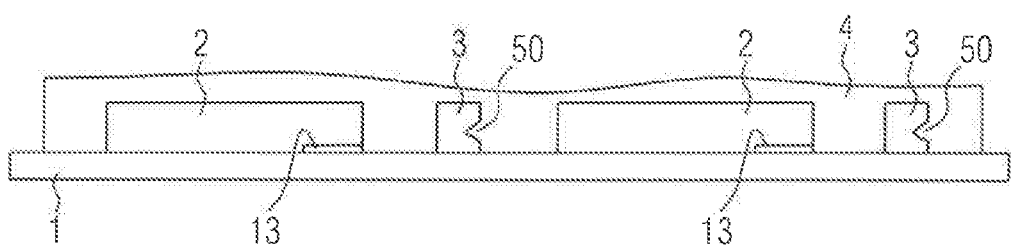

Afterward, a molding compound 4 is applied on the carrier 1, the semiconductor chips 2 and the through-contacts 3 being embedded into said molding compound. Moreover, the cutouts 50 are at least partly filled with molding compound 4. The cutouts 50 may be configured in the form of holes, protuberances or indentations. Each through-contact may comprise at least one cutout 50. A stronger anchoring of the through-contact 3 in the molding compound 4 is achieved as a result. The molding compound 4 may be applied by encapsulation by molding, enveloping, for example, by means of injection molding, casting, printing, lamination of a film or the like. This method state is illustrated in FIG. 2. Depending on the embodiment chosen, in this case both the semiconductor chips 2 and the through-contacts 3 may be overfilled with the molding compound 4, as is illustrated in FIG. 2. The molding compound 4 may consist of or comprise a plastics material, e.g., epoxy or silicone.

In addition, the thickness of the molded body 5 may already be adapted to the thickness of the semiconductor chips 2 during production by a mold being placed onto the semiconductor chips 2 and the through-contacts 3 and the molding material being introduced into the interspaces. In this embodiment it is advantageous if the through-contact is flexible in terms of length or height in order to be able to adapt to semiconductor chips of different thicknesses during the molding process and embedding into the molded body. The through-contact may be configured such that it is elastically or plastically deformable.

Figure 3:
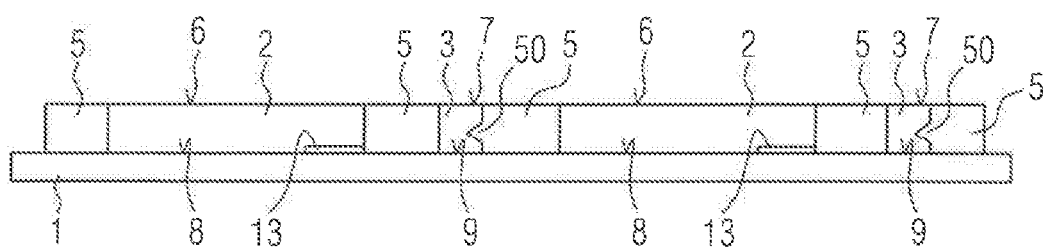

After curing of the molding compound 4, the arrangement in accordance with FIG. 3 is obtained, wherein the semiconductor chips 2 and the through-contacts 3 are embedded into a molded body 5. If the thickness of the molded body 5 is greater than the thickness of the semiconductor chips 2, then after the curing of the molding compound 4 it is still necessary to remove the projecting molding compound 4 in order to obtain the arrangement in accordance with FIG. 3. In this case, a first side 6 of the semiconductor chips 2 and a first contact pad 7 of the through-contacts 3 are arranged on a first side of the molded body 5 and free of the molded body. A second side 8 of the semiconductor chips 2 lies on the carrier 1. A second contact pad 9 of the through-contacts 3 is arranged on a second side of the molded body 5 and bears on the carrier 1. The first and second sides are arranged on opposite sides of the molded body 5. Side faces of the semiconductor chips 2 and side faces of the through-contacts 3 are embedded into the molded body 5. On account of the cutouts 50, the through-contacts 3 are anchored more strongly in the molded body 5 since a molded body 5 is arranged on a straight line between the first and second electrical contact pads 7, 9. A second electrical contact 13 may be provided on the second side 8 of the semiconductor chips 2, which second electrical contact was applied one the second side 8 of the semiconductor chips before the mounting of the semiconductor chips 2. Depending on the embodiment, the second electrical contact 13 may also be applied in a later method step.

Figure 4:
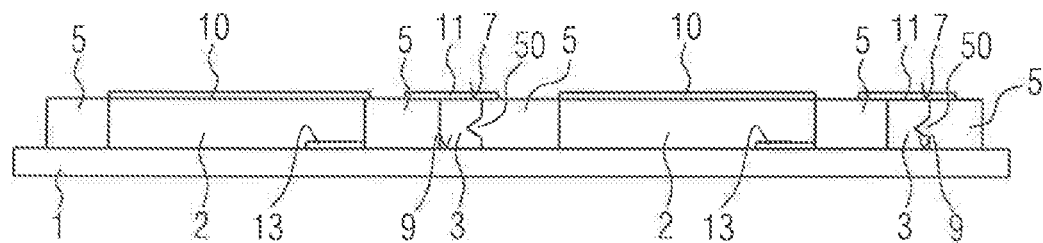

Afterward, as illustrated in FIG. 4, a first electrical contact 10 is applied on the first sides 6 of the semiconductor chips 2. Moreover, before applying the first contact 10 on the first sides 6 of the semiconductor chips, a metal/semiconductor contact may be applied on the first sides 6 of the semiconductor chips. This is advantageous if, during the removal of the projecting molding compound, semiconductor material was also removed from the sides 6 of the semiconductor chips.

In a further embodiment, the semiconductor chips 2 comprise first electrical contacts 10 on the first sides 6 already during the process of embedding into the molded body 5, such that it is no longer necessary to apply the first electrical contacts 10 in the method step in FIG. 4.

In addition, a further first electrical contact 11 is applied on the first contact pad 7 of the through-contacts 3. The first electrical contact 10 and the further first electrical contact 11 are configured, e.g., in the form of a metal layer. The further electrical contact 11 may also extend laterally beyond the through-contact 3 right onto the molded body 5. The metal layer of the first and further first contacts 10, 11 may be produced by a combination of deposition and patterning methods. Deposition methods such as vapor deposition, sputtering or electrode deposition in interaction with photolithographic patterning and dry etching or wet-chemical etching may be used in this case. Moreover, printing methods such as screen printing, ink jet printing or aerosol jet printing, if appropriate with a subsequent sintering step, may be used. Moreover, combinations of the methods described may also be used.

Figure 5:
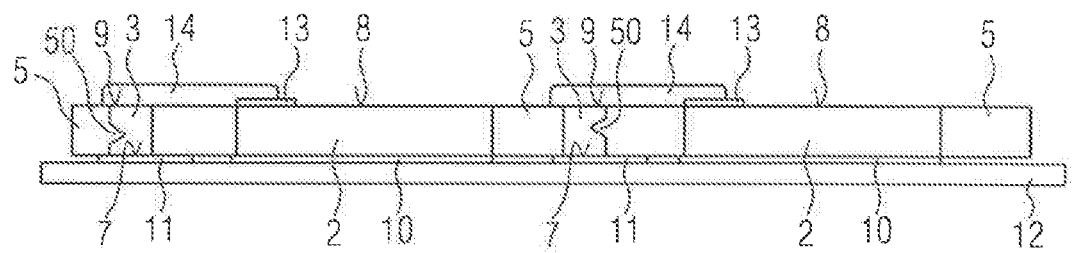

Afterward, the molded body 5 with the semiconductor chips 2 and the through-contacts 3 is detached from the carrier 1 and secured by the first side 6 and the first contact pad 7, respectively, on a second carrier 12, as illustrated in FIG. 5. The second carrier 12 may be configured in accordance with the first carrier 1. The semiconductor chips 2 already comprise a second electrical contact 13 on the second side 8 or the second electrical contacts 13 are applied in an edge region of the second side 8 of the semiconductor chips 2, which faces or is adjacent to a through-contact 3. Furthermore, a second electrical layer 14 is applied on the second contact pad 9 of the through-contacts 3 and the molded body 5 and the second electrical contact 13 of the semiconductor chips 2 in such a way that in each case a second electrical contact 13 of a semiconductor chip 2 is electrically conductively connected to an adjacent through-contact 3 via the second electrically conductive layer 14.

The second electrically conductive layer 14 may be produced by a combination of deposition and patterning methods. Deposition methods such as vapor deposition, sputtering or electrode deposition in interaction with photolithographic patterning and dry etching or wet-chemical etching may be used in this case. Moreover, printing methods such as screen printing, ink jet printing or aerosol jet printing, if appropriate with a subsequent sintering step, may be used. Moreover, combinations of the methods described may also be used.

Figure 6:
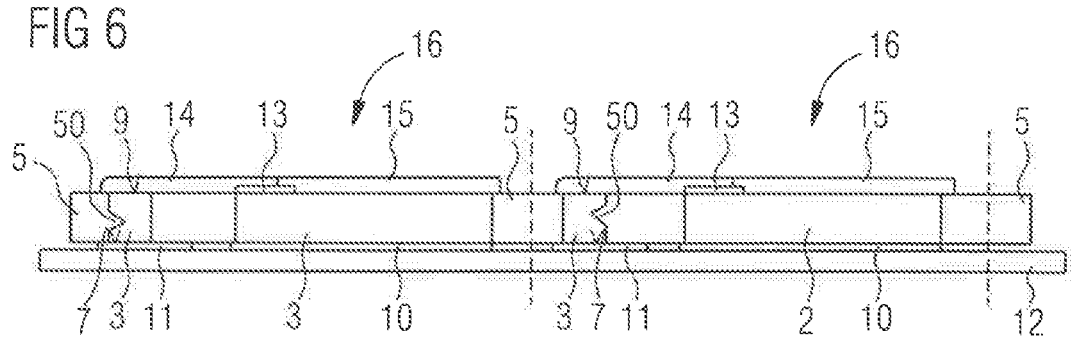

Depending on the embodiment chosen, a conversion layer 15 may be applied on the second side 8 of the semiconductor chips 2, which constitutes a radiation-emitting side of the semiconductor chips. In a further method step, the arrangement is cingulated in accordance with FIG. 6, the separating line being illustrated schematically in the form of dashed lines 16. The singulation may be carried out by sawing, grinding, laser cutting or breaking. In addition, the second carrier 12 is removed.

FIG. 7 shows, in a perspective illustration, an optoelectronic component 16 that was produced in accordance with the method in FIGS. 1 to 6. FIG. 7 illustrates an underside of the semiconductor component after the removal of the second carrier 12. The first electrical contact 10 of the semiconductor chip 2 is arranged on the underside. The molded body 5 laterally surrounds the semiconductor chip 2. In addition, further first electrical contacts 11 of two through-contacts 3 are arranged on the underside. In the exemplary embodiment illustrated, two through-contacts 3 are provided for the semiconductor chip 2 and thus two further first electrical contacts 11 are also arranged on the underside of the component 16. Depending on the embodiment chosen, the two further first electrical contacts 11 of the two through-contacts 3 may be combined by means of a further contact layer, applied on the underside of the molded body 5, to form an electrical terminal.

FIG. 8 shows the top side of the component 16 in a schematic perspective illustration. In the embodiment illustrated, the top side constitutes the side via which radiation is emitted or radiation is received in the configuration as a photosensor. In the exemplary embodiment illustrated, the semiconductor chip 2 comprises two second electrical contacts 13 which are electrically conductively connected to a respective through-contact 3 via corresponding second electrical layers 14. Depending on the embodiment chosen, the two second electrical layers 14 of the two through-contacts 3 may also be configured in the form of a common second electrical layer 14.

Depending on the embodiment chosen, the semiconductor chip 2 may also comprise only one second electrical contact 13. In this embodiment, only one through-contact 3 is then provided as well. The conversion layer 15 is arranged on the top side, said conversion layer being laterally surrounded by the molded body 5. Depending on the embodiment chosen, the conversion layer 15 may be dispensed with and an emission side or an incidence side of the optoelectronic semiconductor chip 2 may be arranged.

The through-contacts 3 are merely illustrated schematically in FIGS. 1 to 8. Possible embodiments of the through-contacts will be described in more specific detail with reference to the following figures.

Figure 9:
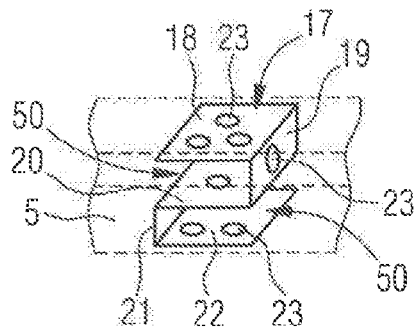
FIG. 9 shows a through-contact in the form of a folded strip.

FIG. 9 shows a through-contact in the form of a folded strip 17 in a schematic illustration. The strip 17 comprises a first section 18, which is arranged parallel to the top side of the molded body or of the component in the installed state. The first section 18 is connected to a second section 20 via a first side 19. The second section 20 is arranged parallel to the first section 18. The first intermediate section 19 may be arranged perpendicular to the first section 18. The first intermediate section 19 may also be bent, folded or arranged at a defined angle of not equal to 90° with respect to the first section 18. The second section 20 is connected to a third section 22 via a second intermediate section 21. The second intermediate section 21 may be configured and arranged in accordance with the first intermediate section 19. The third section 20 is arranged parallel to the first and second sections 18, 20. The folded strip 17 may be produced from a metal. The folded strip 17 may comprise further cutouts 23. The further cutouts 23 may be configured in the form of holes, protuberances of the strip or cutouts to a certain percentage of the layer thickness of the strip. In a simple embodiment, the further cutout 23 is configured as a continuous hole in the strip 17.

The first section 18 constitutes a first contact pad of the through-contact, which is arranged at the top side of the molded body. The third section 22 constitutes a second contact pad of the through-contact which is arranged at the underside of the molded body. The free spaces between the sections 18, 20, 22 constitute cutouts 50.

Figure 10:
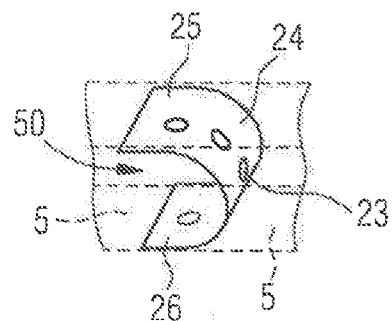
FIG. 10 shows a through-contact in the form of a bent strip.

FIG. 10 shows a through-contact in the form of a bent strip 24. The bent strip 24 comprises a first end region 25 and a second end region 26, which are arranged parallel to one another, for example. The first end region 25 constitutes a first contact pad of the through-contact and is arranged at the top side of the molded body in the installed state. The second end region 26 constitutes a second contact pad of the through-contact and is arranged at the underside of the molded body in the installed state. Depending on the embodiment chosen, the bent strip 24 may comprise at least one or more further cutouts 23. The further cutouts 23 may be indentations, protuberances or continuous holes. The bent strip may be produced from a metal. The free space between the first and second end regions 25, 26 constitutes a cutout 50.

Figure 11:
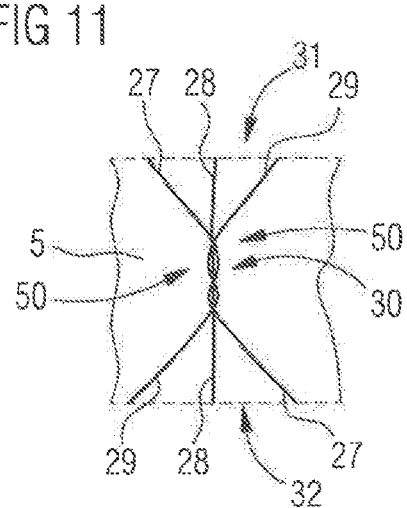
FIG. 11 shows a through-contact in the form of three wires twisted together.

FIG. 11 shows a further embodiment of a through-contact in the form of electrically conductive wires 27, 28, 29 as conduction elements. The wires comprise, e.g., a circular cross section. The wires are mechanically connected to one another, in particular twisted together, in a connection region 30, which is arranged in the center of the length of the wires. In this case, the wires are bent around one another, such that the wires are held together in a positively locking manner in the connection region. Depending on the embodiment chosen, it is also possible to provide only two wires or more than three wires twisted together as a through-contact. The first ends 31 of the wires 27, 28, 29 constitute a first contact pad of the through-contact. Second ends 32 of the wires 27, 28, 29 constitute a second contact pad of the through-contact. In the mounted state, the first ends 31 are arranged in the region of the top side of the molded body 5. The second ends 32 of the wires 27, 28, 29 are arranged in the region of the underside of the molded body. The wires are produced, e.g., from metal or a metal alloy. The free space between the wires 27, 28, 29 constitutes a cutout 50.

Figure 12:
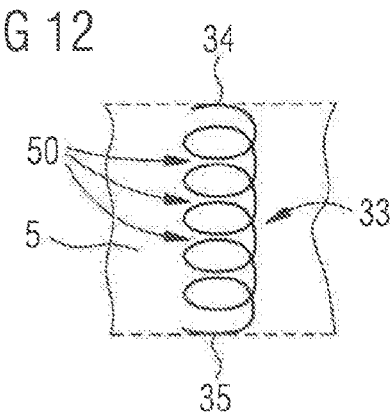
FIG. 12 shows a through-contact in the form of a through-contact arranged perpendicular to the top side of the molded body.

FIG. 12 shows a further embodiment of a through-contact configured in the form of a spiral 33. The spiral 33 comprises a first winding 34. Moreover, the spiral 33 comprises a last winding 35 at the opposite end. The first winding 34 constitutes a first contact pad of the through-contact and is arranged in the region of the top side of the molded body 5 in the installed state. The last winding 35 constitutes a second contact pad of the through-contact and is arranged on the underside of the molded body 5 in the installed state. The spiral 33 is formed from a wire wound around a longitudinal axis. The free spaces between the windings of the spiral 33 constitute cutouts 50.

Figure 13:
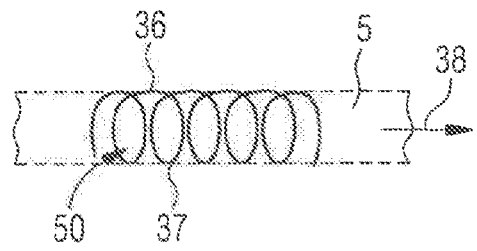
FIG. 13 shows a through-contact in the form of a spiral arranged parallel to the top side of the molded body.

FIG. 13 shows a further embodiment of the through-contact configured in the form of a spiral 33. In this application, however, the spiral 33 is arranged with a longitudinal axis 38 parallel to the top side and respectively to the underside of the molded body 5. In this case, upper winding sections 36 form a first contact pad of the through-contact. Lower winding sections 37 arranged opposite the upper winding sections 36 form a second contact pad of the through-contact. In the installed state, the upper winding sections 36 are arranged at the top side of the molded body 5. The lower winding sections 37 are arranged at the underside of the molded body 5. The molded body 5 is depicted schematically in FIG. 13. The free spaces between the windings of the spiral 33 constitute cutouts 50.

Figure 14:
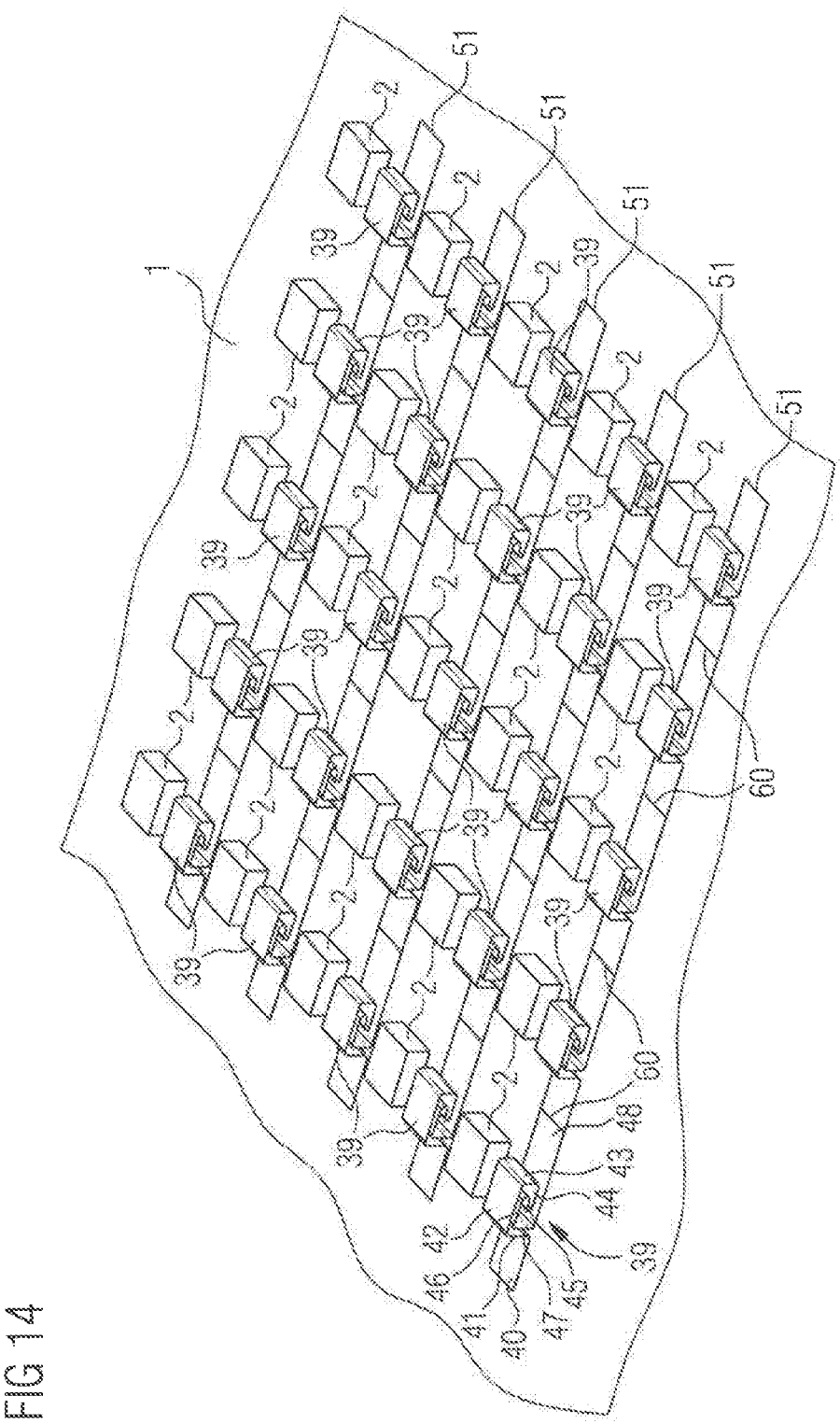
FIG. 14 shows a through-contact in the form of a meandering strip with a semiconductor chip.

FIG. 14 shows, in a schematic illustration, optoelectronic semiconductor chips 2 arranged in a grid on a carrier 1. Alongside the semiconductor chips 2 in each case a through-contact in the form of a meandering strip 39 is arranged on the carrier 1. The meandering strips 39 are configured in the form of a continuous strip 51. Strips 51 are arranged between the series of semiconductor chips 2. The strips 51 are formed from an electrically conductive material, in particular from a metal or a metal alloy. A meandering strip 39 comprises a first section 40, which is connected to a second section via a first intermediate section 41. The second section 42 transitions into a third section 44 via a second intermediate section 43. The third section 44 is arranged parallel to the first and second sections 40, 42 and is arranged between the first and second sections 40, 42 in terms of the height position. The third section 44 transitions into a fourth section 46 via a third intermediate section 45. The fourth section 46 is arranged between the second and third sections 42, 44. The fourth section 46 is connected to a fifth section 48 via a fourth intermediate section 47. The fifth section 48 is arranged at the same height as the first section 40. The first intermediate section 41 and the second intermediate section 43 are arranged parallel to one another. The fourth intermediate section 47 is arranged parallel to the first intermediate section 41. The third intermediate section 44 is arranged between the second and fourth intermediate sections 43, 47. Moreover, the third intermediate section 45 proceeding from an end region of the third section 44 is led obliquely upward to an initial region of the fourth section 46. The second section 42 constitutes a first contact pad of the through-contact. The fifth section 48 constitutes a second contact pad of the through-contact. With the aid of a strip 51 comprising a plurality of meandering strips 39 a plurality of semiconductor chips 2 of a series may simultaneously be embedded into the molded body and correspondingly electrically contacted with the meandering strips 39 during a processing process. After the embedding of the strips 51 into the molded body and the electrical contacting of the semiconductor chips 2, which is carried out in accordance with the process in FIGS. 1 to 6, the strips 51 are subdivided into individual meandering strips 39, with each strip 51 being subdivided at cutting lines 60.

Figure 15:
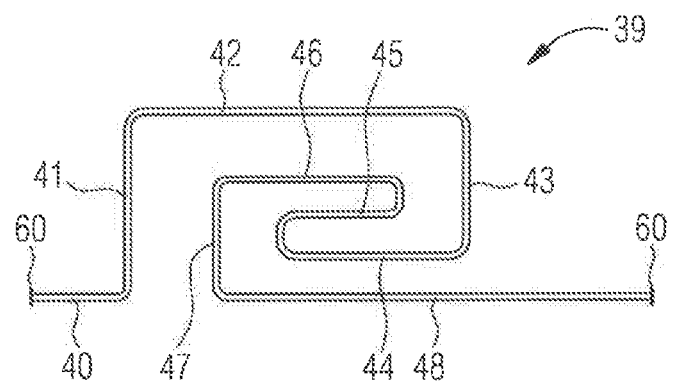
FIG. 15 shows a schematic side view of a meandering strip.

FIG. 15 shows a schematic side view of a singulated meandering strip 39 in accordance with FIG. 14 in a longitudinal direction. The free spaces between the sections 42, 46, 45, 44, 48 constitute cutouts 50.

Figure 16:
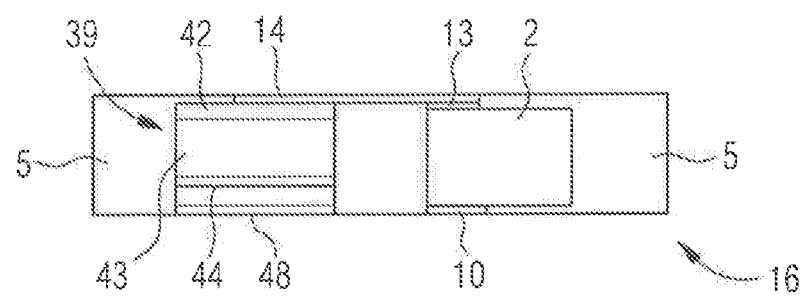
FIG. 16 shows a component comprising a semiconductor chip and a meandering strip.

A semiconductor chip 2 and a meandering strip 39 from FIG. 14 are processed in each case to form a component 16, as illustrated schematically in FIG. 16, in accordance with the method which was described with reference to FIGS. 1 to 6. FIG. 16 shows a view in a transverse direction of the meandering strip 39. In this case, a meandering strip 39 and a semiconductor chip 2 are embedded into a molded body 5.

The configuration of the through-contact in the form of a meandering strip enables cost-effective production, wherein the meandering strip 39 is anchored securely and reliably in the molded body 5. Depending on the embodiment chosen, the meandering strip 39 may comprise further cutouts 23. The further cutouts 23 may be configured in the form of protuberances, depressions or continuous holes. The meandering strip 39 is flexible, in particular elastically or plastically deformable, and may be adapted in terms of its height to semiconductor chips 2 of different thicknesses.

Figure 17:
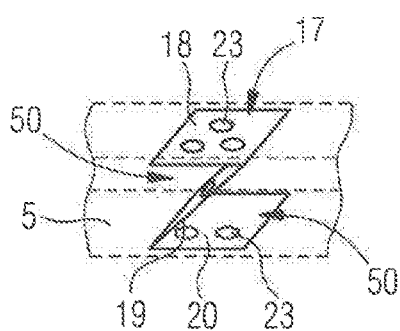
FIG. 17 shows a through-contact in the form of a strip folded in a Z-shape.

FIG. 17 shows a through-contact in the form of a folded strip 17 in a schematic illustration. The strip 17 comprises a first section 18, which is arranged parallel to the top side of the molded body or of the component in the installed state. The first section 18 is connected to a second section 20 via a first intermediate section 19. The second section 20 is arranged parallel to the first section 18. The first intermediate section 19 may be arranged perpendicular to the first section 18. The first intermediate section 19 may also be bent, folded or arranged at a defined angle of not equal to 90° with respect to the first section 18. In the embodiment illustrated, the folded strip comprises a Z-shape in cross section. The folded strip 17 may be produced from a metal. The folded strip 17 may comprise further cutouts 23. The further cutouts 23 may be configured in the form of holes, protuberances of the strip or cutouts up to a certain percentage of the layer thickness of the strip. In a simple embodiment, the further cutout 23 is configured as a continuous hole in the strip 17. The first section 18 constitutes a first contact pad of the through-contact, which is arranged at the top side of the molded body. The second section 20 constitutes a second contact pad of the through-contact which is arranged at the underside of the molded body. The free spaces between the sections 18, 19, 20 constitute cutouts 50.

Figure 18:
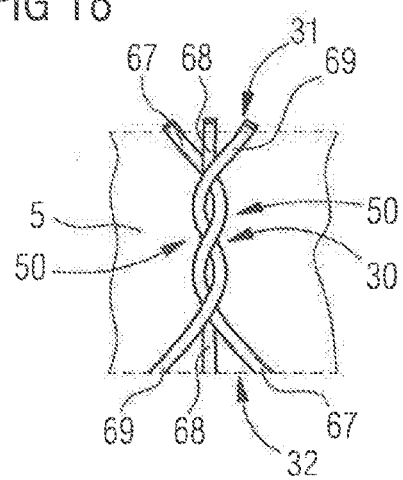
FIG. 18 shows a through-contact in the form of three strips twisted together.

FIG. 18 shows a further embodiment of a through-contact in the form of electrically conductive strips 67, 68, 69 as conduction elements. The strips comprise, e.g., a rectangular cross section. The strips are mechanically connected to one another, in particular twisted together, in a connection region 30 arranged in the center of the length of the strips. In this case, the strips are bent around one another, such that the strips are held together in a positively locking manner in the connection region. Depending on the embodiment chosen, it is also possible to provide only two strips or more than three strips twisted together as a through-contact. The first ends 31 of the strips 67, 68, 69 constitute a first contact pad of the through-contact. Second ends 32 of the strips 67, 68, 69 constitute a second contact pad of the through-contact. In the mounted state, the first ends 31 of the strips are arranged in the region of the top side of the molded body 5. The second ends 32 of the strips 67, 68, 69 are arranged in the region of the underside of the molded body. The strips are produced, e.g., from metal or a metal alloy. The free spaces between the strips 67, 68, 69 constitute a cutout 50.

Figure 19:
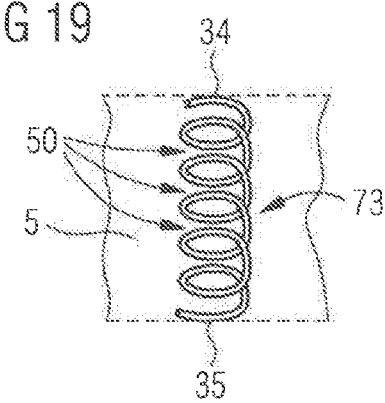
FIG. 19 shows a through-contact in the form of a through-contact arranged perpendicular to the top side of the molded body in the form of a strip spiral.

FIG. 19 shows a further embodiment of a through-contact which is configured in the form of a second spiral 73. The second spiral 73 is formed from a strip. The second spiral 73 comprises a first winding 34. Moreover, the spiral 73 comprises a last winding 35 at the opposite end. The first winding 34 constitutes a first contact pad of the through-contact and is arranged in the region of the top side of the molded body 5 in the installed state. The last winding 35 constitutes a second contact pad of the through-contact and is arranged on the underside of the molded body 5 in the installed state. The second spiral 73 is formed from a strip wound around a longitudinal axis. The free spaces between the windings of the second spiral 73 constitute cutouts 50.

Figure 20:
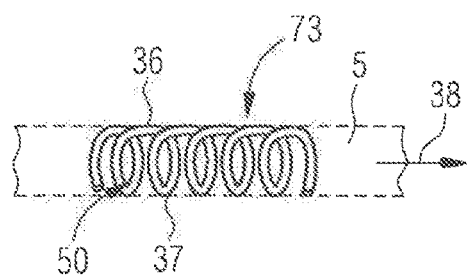
FIG. 20 shows a through-contact in the form of a strip spiral arranged parallel to the top side of the molded body.

FIG. 20 shows a further embodiment of the through-contact which is configured in the form of a second spiral 73. In this application, however, the second spiral 73 is arranged with a longitudinal axis 38 parallel to the top side and respectively to the underside of the molded body 5. In this case, upper winding sections 36 form a first contact pad of the through-contact. Lower winding sections 37 arranged opposite the upper winding sections 36 form a second contact pad of the through-contact. In the installed state, the upper winding sections 36 are arranged at the top side of the molded body 5. The lower winding sections 37 are arranged at the underside of the molded body 5. The molded body 5 is depicted schematically in FIG. 20. The free spaces between the windings of the spiral 33 constitute cutouts 50.

Figure 21:
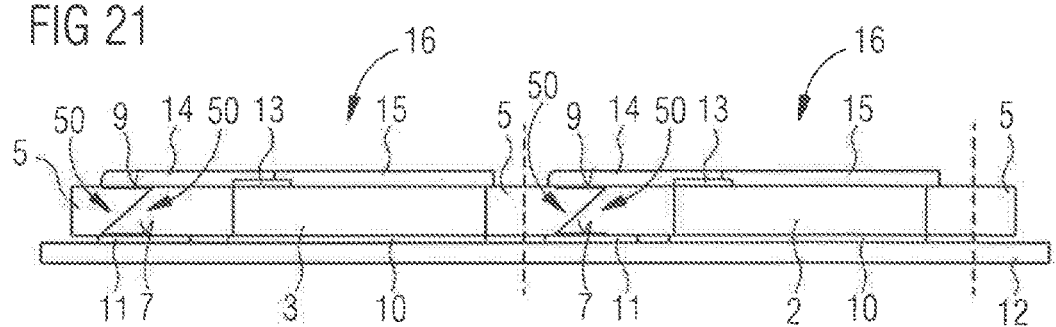
FIG. 21 shows a schematic cross section through an arrangement comprising two optoelectronic components comprising through-contacts in the form of Z-shaped strips.

FIG. 21 shows two optoelectronic components 16, which were produced in accordance with the method steps which were described above with reference to FIGS. 1 to 6. In this exemplary embodiment, a strip 17 folded in a Z-shape is provided as a through-contact. As explained above, the forms of through-contacts described with reference to the previous figures may also be used as the through-contact, in order to produce optoelectronic components comprising through-contacts.

The method described with reference to FIGS. 1 to 6 may also be used for embedding the optoelectronic component and introducing at least two through-contacts, wherein the component comprises the first electrical contact 10 and the second electrical contact 13 on the top side, wherein the first electrical contact and the second electrical contact are led via two corresponding through-contacts in the molded body onto an underside.

FIG. 22 shows, in a schematic arrangement, an optoelectronic component 16 comprising on an upper side a first and a second electrical contact 10, 13, which are spaced apart from one another and electrically insulated from one another. The two electrical contacts are used for operating the component 16. The first electrical contact 10 is electrically conductively connected to a through-contact 3 via a second electrical layer 14. The through-contact 3 is embedded into the molded body 5 and led as far as a lower side of the molded body 5. A further first electrical contact 11 is arranged on the lower side of the molded body 5, said further first electrical contact being electrically conductively connected to the through-contact 3. The second electrical contact 13 is electrically conductively connected to a further through-contact 3 via a further second electrical layer 14. The further through-contact 3 is embedded into the molded body 5 and led as far as a first side of the molded body 5. A further first electrical contact 11 is arranged on the first side of the molded body 5, said further first electrical contact being electrically conductively connected to the through-contact 3. The through-contact 3 may be realized in one of the forms described in the previous examples. In particular, the through-contact can be configured in the form of a bent or folded strip or in the form of a spiral or in the form of connected conduction elements.

FIG. 23 shows a view from below of the component 16 from FIG. 22 with the view encompassing the two further first electrical contacts 11 of the two through-contacts 3.

Although the invention has been more specifically illustrated and described in detail by means of the preferred exemplary embodiment, nevertheless the invention is not restricted by the examples disclosed and other variations may be derived therefrom by the person skilled in the art, without departing from the scope of protection of the invention.

The invention claimed is:

1. An optoelectronic component comprising:
a semiconductor chip;
a molded body; and
an electrical through-contact constituting an electrically conductive connection through the molded body,
wherein the through-contact and the semiconductor chip are embedded alongside one another and are spaced apart in the molded body,
wherein an electrical contact of the semiconductor chip is located on a top side of the semiconductor chip,
wherein a first contact pad of the through-contact is arranged at an underside of the molded body,
wherein a second contact pad of the through-contact is arranged at a top side of the molded body,
wherein the second contact pad is electrically conductively connected to the electrical contact of the semiconductor chip,
wherein the through-contact is arranged such that the molded body is arranged at least in a section between the first and second contact pads on a straight line between the first and second contact pads,
wherein the through-contact comprises a bent or folded strip having a bent or folded length, a width and a thickness,
wherein the width is substantially larger than the thickness,
wherein the bent or folded length is substantially larger than the width,
wherein a perpendicular of a surface of the bent or folded strip defined by the bent or folded length and the width is parallel to the top side of the molded body,
wherein a first section of the strip forms the first contact pad,
wherein a second section of the strip forms the second contact pad, and
wherein the strip is flexible between the first and second contact pads.

2. The component according to claim 1, wherein the through-contact comprises a spiral shape, wherein a first end of the spiral shape forms the first contact pad, and wherein a second end of the spiral shape forms the second contact pad.

3. The component according to claim 1, wherein the through-contact comprises a spiral shape, wherein the spiral shape is arranged parallel to a longitudinal axis transverse with respect to a top side of the molded body, wherein upper winding sections form a first contact pad of the through-contact, and wherein lower winding sections arranged opposite the upper winding sections form the second contact pad.

4. The component according to claim 1, wherein the through-contact comprises at least two conduction elements which are mechanically connected to one another, and wherein ends of the conduction elements form the first and second contact pads.

5. The component according to claim 1, wherein a through-contact comprises a cutout which is at least partly filled with the molded body.

6. The component according to claim 1, wherein the through-contact comprises at least two conduction elements which are mechanically connected to one another, wherein ends of the conduction elements form the first and second contact pads, wherein a strip comprises at least two sections, and wherein the at least two sections are arranged substantially parallel to one another and are connected to one another via at least one intermediate section.

7. The component according to claim 6, wherein the strip is meandering.

8. The component according to claim 1, wherein the through-contact comprises a bent or folded strip, wherein a first section of the strip forms the first contact pad, wherein a second section of the strip forms the second contact pad, wherein the first and second sections are connected to one another via a connection section, wherein the strip is flexible between the first and second contact pads, and wherein at least two sections of the strip are arranged substantially parallel to one another and are connected to one another via at least one intermediate section.

9. The component according to claim 8, wherein the strip is meandering.

10. The component according to claim 1, further comprising a further electrical through-contact, wherein the further electrical through-contact constitutes an electrically conductive connection through the molded body, wherein the further through-contact is embedded in the molded body and spaced apart from the semiconductor chip and from the through-contact, wherein the semiconductor chip comprises a further electrical contact on the top side of the semiconductor chip, wherein a further first contact pad of the further through-contact is arranged at the underside of the molded body, wherein a further second contact pad of the further through-contact is located at the top side of the molded body, wherein the further second contact pad is electrically conductively connected to the further second electrical contact of the semiconductor chip, and wherein the further through-contact is arranged such that the molded body is arranged at least in a section between the first and second contact pads on a straight line between the first and second contact pads.

11. The component according to claim 1, further comprising a further electrical through-contact, wherein the further electrical through-contact constitutes an electrically conductive connection through the molded body, wherein the further through-contact is embedded in the molded body and spaced apart from the semiconductor chip and from the through-contact, wherein a further electrical contact of the semiconductor chip is formed on the top side of the semiconductor chip, wherein a further first contact pad of the further through-contact is arranged at the underside of the molded body, wherein a further second contact pad of the further through-contact is arranged at the top side of the molded body, wherein the further second contact pad is electrically conductively connected to the further second electrical contact of the semiconductor chip, wherein the further through-contact is arranged such that the molded body is arranged at least in a section between the first and second contact pads on a straight line between the first and second contact pads, and wherein the further through-contact comprises a bent or folded strip, a spiral or twisted conduction elements.

12. The component according to claim 1, wherein the semiconductor chip comprises a first electrical contact on an underside.

13. A method for producing an optoelectronic component, the method comprising
embedding a semiconductor chip and at least one through-contact into a molded body,
wherein the through-contact constitutes an electrically conductive connection from a top side to an underside of the molded body,
wherein the through-contact and the semiconductor chip are embedded alongside one another and spaced apart in the molded body,
wherein a second electrical contact of the semiconductor chip is located on the top side of the semiconductor chip,
wherein a first contact pad of the through-contact is arranged on the underside of the molded body,
wherein a second contact pad of the through-contact is arranged on the top side of the molded body,
wherein the second contact pad is electrically conductively connected to the second electrical contact of the semiconductor chip,
wherein the through-contact is arranged such that the molded body is arranged at least in a section between the first and second contact pads on a straight line between the first and second contact pads,
wherein the through-contact comprises a folded strip,
wherein a first section of the strip forms the first contact pad,
wherein a second section of the strip forms the second contact pad,
wherein the first and second sections are connected to one another via a connection section,
wherein the strip is flexible between the first and second contact pads, and
wherein the through-contact comprises a cutout which is filled with the molded body.

14. The method according to claim 13, wherein the through-contact comprises a spiral shape, and wherein the spiral shape is arranged with a longitudinal axis parallel or perpendicular between the top side and the underside of the molded body.

15. The method according to claim 13, wherein the through-contact comprises at least two conduction elements which are mechanically connected to one another.

16. An optoelectronic component comprising:
a semiconductor chip;
a molded body; and
an electrical through-contact constituting an electrically conductive connection through the molded body,
wherein the through-contact and the semiconductor chip are embedded alongside one another and are spaced apart in the molded body,
wherein an electrical contact of the semiconductor chip is located on a top side of the semiconductor chip,
wherein a first contact pad of the through-contact is arranged at an underside of the molded body,
wherein a second contact pad of the through-contact is arranged at a top side of the molded body,
wherein the second contact pad is electrically conductively connected to the electrical contact of the semiconductor chip,
wherein the through-contact is arranged such that the molded body is arranged at least in a section between the first and second contact pads on a straight line between the first and second contact pads,
wherein the through-contact comprises a spiral shape,
wherein the spiral shape is arranged parallel to a longitudinal axis transverse with respect to a top side of the molded body,
wherein upper winding sections form a first contact pad of the through-contact, and
wherein lower winding sections arranged opposite the upper winding sections form the second contact pad.

17. An optoelectronic component comprising:
a semiconductor chip;
a molded body; and
an electrical through-contact constituting an electrically conductive connection through the molded body, wherein the through-contact and the semiconductor chip are embedded alongside one another and are spaced apart in the molded body, wherein an electrical contact of the semiconductor chip is located on a top side of the semiconductor chip, wherein a first contact pad of the through-contact is arranged at an underside of the molded body, wherein a second contact pad of the through-contact is arranged at a top side of the molded body, wherein the second contact pad is electrically conductively connected to the electrical contact of the semiconductor chip, wherein the through-contact is arranged such that the molded body is arranged at least in a section between the first and second contact pads on a straight line between the first and second contact pads, and wherein the through-contact comprises at least two conduction elements which are mechanically connected to one another, and wherein ends of the conduction elements form the first and second contact pads.

18. An optoelectronic component comprising:
a semiconductor chip;
a molded body; and
an electrical through-contact constituting an electrically conductive connection through the molded body,
wherein the through-contact and the semiconductor chip are embedded alongside one another and are spaced apart in the molded body,
wherein an electrical contact of the semiconductor chip is located on a top side of the semiconductor chip,
wherein a first contact pad of the through-contact is arranged at an underside of the molded body,
wherein a second contact pad of the through-contact is arranged at a top side of the molded body,
wherein the second contact pad is electrically conductively connected to the electrical contact of the semiconductor chip,
wherein the through-contact is arranged such that the molded body is arranged at least in a section between the first and second contact pads on a straight line between the first and second contact pads, and
wherein the through-contact comprises a cutout which is at least partly filled with the molded body.

\* \* \* \* \*